United States Patent [19]

Lamb et al.

[11] Patent Number: 5,025,280
[45] Date of Patent: Jun. 18, 1991

[54] IMMERSION DEVELOPMENT AND RINSE MACHINE AND PROCESS

[75] Inventors: William E. Lamb, Bellaire; Jerome L. Kowaleski, Meadows; Vojtech Haikl, Houston; Alan R. Bittancourt, Rosenberg; Harvey S. Daugherty, Richmond, all of Tex.

[73] Assignee: Texas Instruments Incorporated, Dallas, Tex.

[21] Appl. No.: 436,160

[22] Filed: Nov. 13, 1989

Related U.S. Application Data

[62] Division of Ser. No. 134,284, Dec. 17, 1987, Pat. No. 4,902,608.

[51] Int. Cl.$^5$ .......................... G03D 3/06; G03D 3/08
[52] U.S. Cl. .................................. 354/299; 354/322; 354/324; 354/330; 134/76; 134/902
[58] Field of Search ............... 354/299, 320, 322, 330, 354/324; 156/345; 134/76, 902

[56] References Cited

U.S. PATENT DOCUMENTS

| | | | |
|---|---|---|---|
| 4,136,940 | 1/1979 | Liu | 354/317 |
| 4,429,983 | 2/1984 | Cortellino et al. | 354/330 |
| 4,557,785 | 12/1985 | Ohkuma | 156/345 |
| 4,857,430 | 8/1989 | Millis et al. | 354/298 X |

FOREIGN PATENT DOCUMENTS

| | | | |
|---|---|---|---|
| 56-55048 | 5/1981 | Japan | 430/325 |
| 59-105321 | 6/1984 | Japan | 430/325 |

Primary Examiner—A. A. Mathews
Attorney, Agent, or Firm—Gary C. Honeycutt; Melvin Sharp; N. Rhys Merrett

[57] ABSTRACT

A machine has been developed for photoresist processing which has two filtered upward flowing baths, one for the develop fluid and one for the rinse fluid. In order to be able to develop photoresist patterns with submicron geometries, it is necessary to retreat from the current method of developing on a conventional spin developer. The batch immersion develop would suffice in certain applications, but contamination and automation obstacles cannot be overcome with the batch immersion process. Also, the develop process cannot be accomplished on very small geometries which developing pattern side up due to ununiform developing across the wafer causing critical dimension sizing problems. The described concept utilized an upside down immersion process with automated in line capabilities. It requires a filtered bubble free, temperature controlled, slow upward flowing develop chemical which the wafer is immersed into while spinning very slowly. The process required critical timing capabilities and an expeditious transition from the develop to the rinse cycle which also requires a similar upside down immersion into the upward flowing filtered rinse fluid.

10 Claims, 2 Drawing Sheets

IMMERSION DEVELOPMENT AND RINSE MACHINE AND PROCESS

This is a division of application Ser. No. 07/134,284, filed Dec. 17, 1987, now U.S. Pat. No. 4,902,608.

FIELD OF THE INVENTION

This invention relates to semiconductor processing and more particularly to a machine and process for immersion development and rinse of photoresist patterns on semiconductor wafers.

BACKGROUND OF THE INVENTION

Resist patterning techniques employed in the semiconductor lithographic process fundamental to integrated circuit manufacturing usually rely on a fluid dissolution step to remove photoresist polymer either made more soluble or left less resistant to dissolution by selective exposure to some type of photon irradiation or particle bombardment.

It is critically important to control this pattern developing dissolution uniformity carefully to achieve close dimensional control of pattern features, the tolerances of which affect yield and practicable design performance limits of semiconductor devices.

In order to be able to develop uniform photoresist patterns with sub micron geometries, it is necessary to retreat from the current method of developing on a conventional spin developer. Batch immersion developing in a conventional developer is acceptable for some applications, but contamination, uniformity and automation obstacles are not overcome with batch immersion processing. Also, the develop process cannot be accomplished uniformly on very small geometries when developing the wafer pattern side up due to nonuniform developing across the wafer causing critical dimension sizing problems.

Other present develop processes employ fixed developing times which are empirically determined to achieve the desired pattern dimensions, with every attempt being made to hold substrate, resist, and exposing and developing system parameters fixed at optimum values.

Another process used in photoresist removal is to determine the endpoint of the photoresist removal process. Accurate determination of endpoint can provide a basis for automatic adjustment of total development time, which is composed of the time required to initially clear resist in the high solubility areas of the pattern plus predetermined additional development time, for example 50% additional time past end point.

The automatic develop time adjustment can largely compensate, as needed, for patterning process variations in such factors as exposure system intensity and/or timing mechanism, resist thickness, resist sensitivity, substrate reflectance, develop solution effectiveness, developing fluid dispense rate, distribution, temperature, chamber ventilation, substrate spin speed and delay between exposure and development. Monitoring of automatically determined developing times provides an indication of the degree of control being achieved over the various process parameters and any significant drift of developing time can be used to alert technical personnel.

Monitoring changing thickness of transparent films by interpretation of optical interference occurring between film top and substrate reflections of a beam of monochromatic light is a method which has been effectively used in various material subtractive processes in semiconductor fabrication, including resist developing in favorable circumstances.

The effectiveness of optical interference techniques for resist developing end point determination can be seriously degraded by processing considerations sometimes encountered in practice.

In spin/spray developing processes, the spray can disperse the beam, and extraneous optical interference caused by varying developing fluid film thickness overlying the developing resist can also limit signal quantity. Attempts to minimize spray density of fluid film thickness in order to enhance signal quantity can degrade development rate radial and angular uniformity. Low reflectivity of the substrate due to surface texture, transparent film interference integral to the semiconductor substrate, or semitransparent film absorption can reduce signal accuracy. Also a pattern with unfavorable low proportion of the resist area designed for removal present little area changing in thickness such that little signal is obtainable. As the geometries of integrated circuits get smaller, it is more important that all aspects of processing be controlled. Manufacturing process have been based on a "recipe" process, that is, various procedures are followed to produce a desired effect with no regard to what is actually occurring on the semiconductor wafer surface.

The "recipe" method has worked well, but with the requirement for tighter control on wafers with very small geometries, the difficulty of controlling all the variables in a particular process becomes greater.

SUMMARY OF THE INVENTION

The present invention is an apparatus and process for providing an automatic in-line immersion develop and rinse process by immersing a wafer face down, while slowly rotating in a filtered temperature controlled, upward flowing developer solution. The wafer is slowly rotated to disperse the dissolving photoresist and to prevent accumulation of micro bubbles in the developing photoresist patterns.

After the desired develop time is complete, the wafer is rapidly transferred from the developing bath, while still on the same chuck, into a deionized water rinse bath where it is slowly turned in the water.

Upon completion of the deionized water rinse, the wafer is lifted from the water bath and the the spin speed is increased to remove the water from the wafer.

The apparatus to handle the immersion process consists of two separate fluid baths, each utilizing separate closed loop, continuously filtered temperature systems. The two baths are the developer and rinse baths.

Wafer handling can be accomplished by a vacuum chuck holding the wafer from the backside by a vacuum, which is connected to a low rpm pneumatic motor that is mounted on a frame that is movable in two planes, vertically and horizontally. The vertical motion is the up-down movement for moving the semiconductor wafers in and out of the fluid baths. The horizontal or lateral transfer movement is for transferring the semiconductor wafer into the developer rinse, to the deionized water rinse and then to a spin dry position. Other wafer holding methods can be used.

The apparatus is designed to be a part of serial flow semiconductor processing line where the wafers are delivered singly to the pneumatic chuck, processed as described, above and then continued along the processing line. However, the apparatus may be used as a stand alone processing station.

The technical advance represented by the invention as well as the objects thereof will become apparent from the following description of a preferred embodiment of the invention when considered in conjunction with the accompanying drawings, and the novel features set forth in the appended claims.

DESCRIPTION OF A PREFERRED EMBODIMENT

Figure 1:
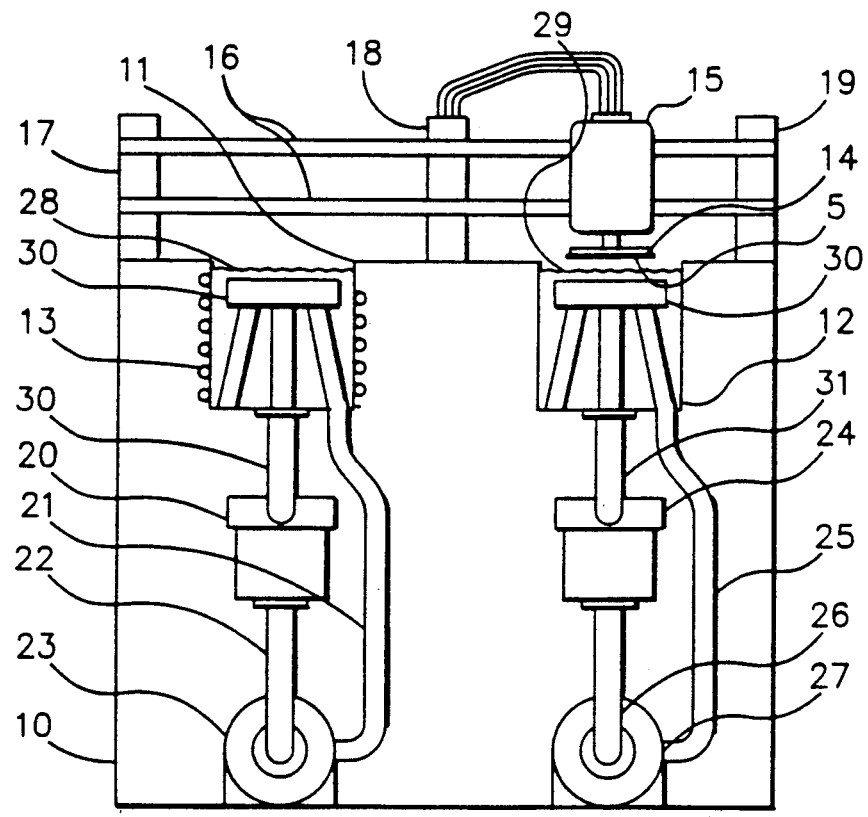
FIG. 1 is a drawing of an immersion development and rinse machine of the present invention.
Figure 2:
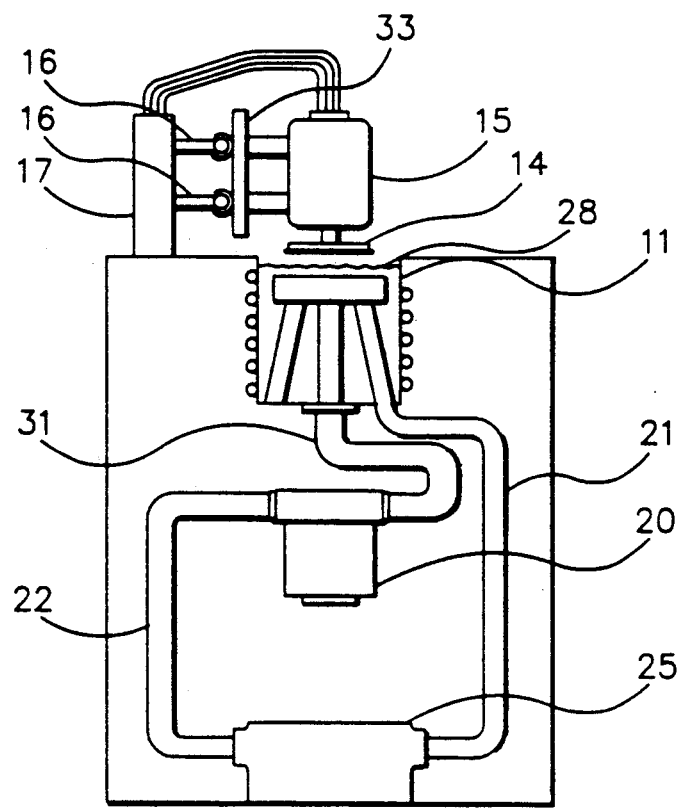
FIG. 2 is a side view of the immersion and development machine of FIG. 2.

FIGS. 1 and 2 illustrate an apparatus of the present invention. A semiconductor wafer immersion develop machine is illustrated having a main housing 10. The housing includes two tanks 11 and 12. Tank 11 holds developer liquid 28 and tank 12 is for deionized water 29, for rinsing the developed semiconductor wafers. Both tanks 11 and 12 are filtered upward flowing baths.

The developer tank is maintained at a preset temperature with coils 13. The temperature of the developer bath is maintained at a constant temperature to ensure a constant developing rate. The developer fluid is pumped from tank 11 by pump 23 through drain 21, and returned to tank 11 through hose 22, filter 20, and returned hose 30.

Controller 30, used in both the developer and rinse baths, is used to control the direction of flow the fluid in the tank. It consists of a drilled manifold which directs the fluid form pump 23 through line 21 in an upward flow toward the semiconductor wafer. The manifold is submerged in the fluid tank.

Since it is important to maintain a constant developer strength, developer analyzer and replenisher system as disclosed in copending patent application, Ser. No. 134,438, filed Dec. 17, 1987, now U.S. Pat. No. 4,857,750, and entitled SENSOR FOR DETERMINING PHOTORESIST DEVELOPER STRENGTH, may be used in conjunction with the present invention.

The rinse tank 12 has a drain and filter system similar to that of the developer tank 11. The rinse water in tank 12 is removed through drain 25 and returned to the rinse tank through pump 27, hose 26 connecting pump 27 with filter 24, and hose 31 connecting filter 24 with tank 12.

A semiconductor wafer 5 is processed by mounting it on a vacuum chuck 14 that is slowly turned by a motor 15. Motor 15 may be moved horizontally on tracks 16 and vertically on mechanism 33. Tracks 16 extend across and to each side of tanks 11 and 12 so that the semiconductor wafer 5 may be moved to a location over each tank.

The semiconductor wafer is first lowered into the developer fluid 28 to develop the photoresist polymer thereon, and after the development process is complete, the wafer is raised and moved horizontally until it is over the rinse water 29. Once it is positioned over the rinse water, the wafer is lowered into the water to rinse any residual developer form the semiconductor wafer.

The process for developing the photoresist polymer is an upside down immersion processed with automated in line capabilities, and requires a filtered bubble free, temperature controlled, slow upward flowing develop chemical in which the semiconductor wafers is immersed into while spinning very slowly, and may be described as follows.

A semiconductor wafer 5 is moved down a processing line (not illustrated) and is acquired by the vacuum chuck 14. Vacuum chuck 14 moves the semiconductor wafer 5 into the flowing develop bath 28 and spins the wafer as a slow speed during the develop cycle. After the proper develop time, the vacuum chuck 14 which is connected to an air operated spin motor 15 mounted on a pneumatic driven actuator assembly 33 moves rapidly on guide rails 16 to the rinse process bath 29 and repeats the timed immersion process in the rinse fluid 29. After the rinse period, the wafer is raised from and removed from the rinse bath and spin dried. The semiconductor wafer is then removed for the next process step.

Figure 3:
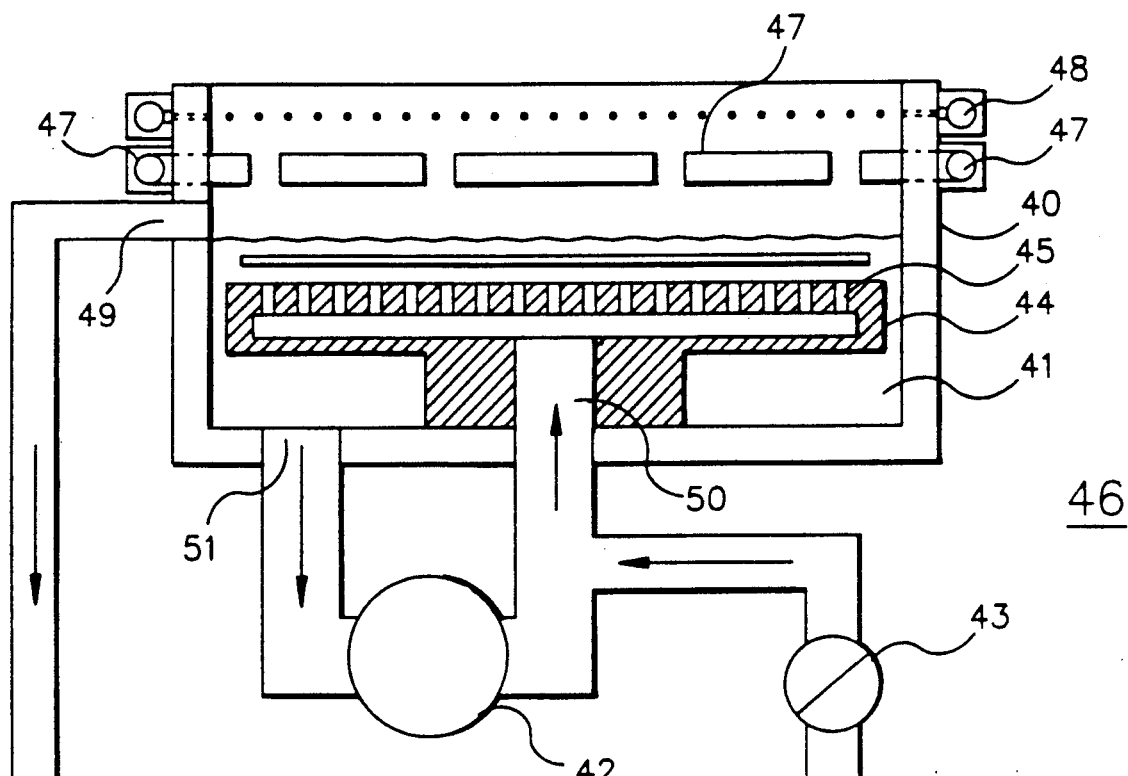
FIG. 3 a more detailed develop tank and fluid circulation system.

FIG. 3 illustrates a more detailed embodiment of a develop station/tank. Tank 40 is filed with developer 41. The surface of the developer 41 is covered with nitrogen which is introduced into the tank at port 48 and is exhausted at ports 47. Manifold 44 is mounted at the bottom of the tank and developer fluid is pumped into the manifold at 50 and flows out of the manifold through holes 45 and onto the surface of the submerged wafer 46. Developer fluid is removed from the tank at port 51 and recycled through the tank by pump 42. Fresh developer fluid may be introduced into the tank though value 43, and any overflow of fluid is drained at overflow 49.

Figure 4:
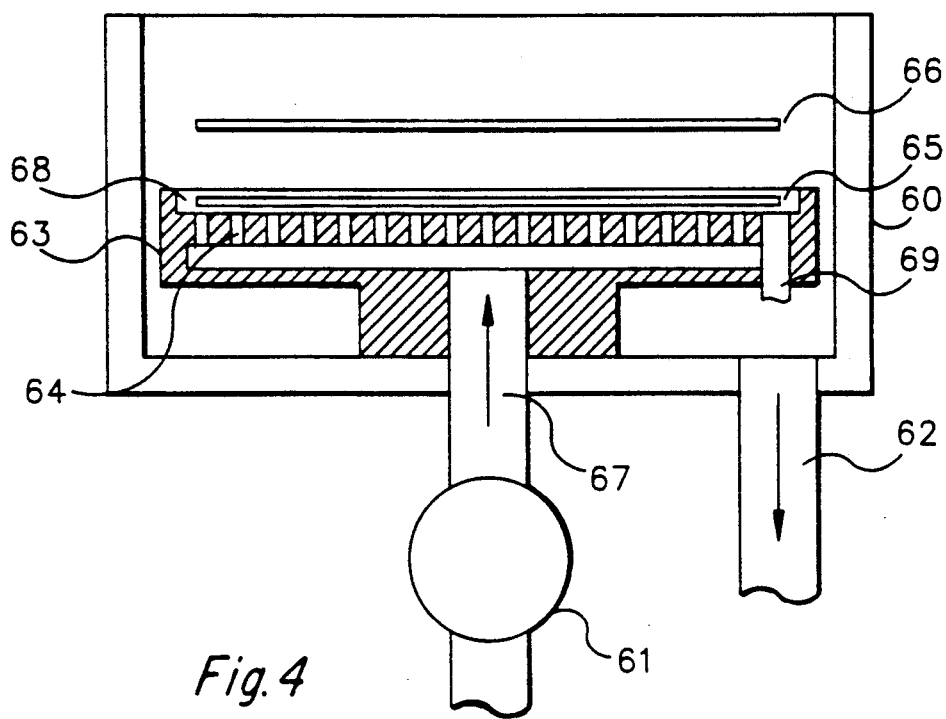
FIG. 4 illustrates a more detained rinse/dry tank and station.

FIG. 4 illustrates in more detail a rinse/dry tank/station. Tank 60 has a manifold mounted at the bottom thereof. Pump 61 pumps deionized water into the manifold and out through holes 64 onto semiconductor wafer 65 which resided in a reservoir 68. The rinse water exits the reservoir at 69 and flows from tank 60 though drain 62. After the wafer has been rinsed, it is raised to a dry position as indicated by wafer 66.

What is claimed is:

1. A semiconductor wafer processing apparatus wherein semiconductor wafers are spun developed and rinsed in developer fluid and a rinse fluid, comprising; first and second fluid tanks for holding the developer fluid and rinse fluid, each tank interconnected with a fluid circulation system, a vacuum chuck for holding a semiconductor wafer in an upside-down position, a track and actuation mechanism for moving the vacuum chuck in vertical and horizontal directions, and a spin motor for rotating said vacuum chuck and the semiconductor wafer in said developer and rinse fluids.

2. The apparatus according to claim 1, wherein said spin motor and actuation mechanism are pneumatically operated.

3. The apparatus according to claim 1, wherein each fluid circulation system comprises a drilled manifold, a pump and filter interconnected with each other and with one of said first and second fluid tanks.

4. The apparatus according to claim 3, wherein said first fluid tank is temperature controlled.

5. The apparatus according to claim 3, wherein said circulation system is an upward flow system.

6. A semiconductor wafer processing apparatus wherein semiconductor wafers are spun developed and rinsed in developer fluid and a rinse fluid, comprising; first and second fluid tanks for holding said developer and said rinse, respectively, a vacuum chuck for holding a semiconductor wafer in an upside-down position, a motor connected to said vacuum chuck for rotating the semiconductor wafer, a track and actuation mechanism for moving the vacuum chuck and motor in a vertical and horizontal directions, and two fluid circulation systems interconnected with said tanks, respectively, said motor rotating said vacuum chuck and the semiconductor wafer in said developer and rinse fluids.

7. The apparatus according to claim 6, wherein said spin motor and actuation mechanism is pneumatically operated.

8. The apparatus according to claim 6, wherein each fluid circulation system comprises a drilled manifold, a pump and filter interconnected with each other and a fluid tank, wherein the circulation within the system is upward through said drilled manifold.

9. The apparatus according to claim 6, wherein said first fluid tank is temperature controlled.

10. The apparatus according to claim 6, wherein said circulation systems are upward flow systems.

* * * * *